(12) United States Patent
Doi et al.

(10) Patent No.: US 11,597,038 B2
(45) Date of Patent: Mar. 7, 2023

(54) WELDING STRUCTURE, WIRING BOARD WITH METAL PIECE, AND WELDING METHOD

(71) Applicant: Fujikura Ltd., Tokyo (JP)

(72) Inventors: Yoshiharu Doi, Sakura (JP); Toshitaka Namba, Sakura (JP); Kenji Takahashi, Sakura (JP)

(73) Assignee: Fujikura Ltd., Tokyo (JP)

( * ) Notice: Subject to any disclaimer, the term of this patent is extended or adjusted under 35 U.S.C. 154(b) by 308 days.

(21) Appl. No.: 16/650,726

(22) PCT Filed: Dec. 27, 2018

(86) PCT No.: PCT/JP2018/048031
§ 371 (c)(1),
(2) Date: Mar. 25, 2020

(87) PCT Pub. No.: WO2019/131828
PCT Pub. Date: Jul. 4, 2019

(65) Prior Publication Data
US 2020/0306882 A1   Oct. 1, 2020

(30) Foreign Application Priority Data
Dec. 28, 2017   (JP) .............................. JP2017-253541

(51) Int. Cl.
*B23K 26/323*   (2014.01)
*B23K 26/28*   (2014.01)
(Continued)

(52) U.S. Cl.
CPC ............ *B23K 26/323* (2015.10); *B23K 26/28* (2013.01); *H01R 4/029* (2013.01); *H01R 12/59* (2013.01);
(Continued)

(58) Field of Classification Search
CPC .......... H01R 12/62; H05K 2201/0969; H05K 1/118; H05K 3/328; B23K 26/21;
(Continued)

(56) References Cited

U.S. PATENT DOCUMENTS

| 5,306,891 A | 4/1994 | Fleming et al. |
| 2007/0199926 A1 | 8/2007 | Watanabe et al. |
| 2017/0050269 A1 | 2/2017 | Nakagawa et al. |

FOREIGN PATENT DOCUMENTS

| CN | 1610484 A | 4/2005 |
| CN | 102281985 A | 12/2011 |

(Continued)

OTHER PUBLICATIONS

International Search Report issued in corresponding International Application No. PCT/JP2018/048031, dated Mar. 26, 2019 (3 pages).
(Continued)

*Primary Examiner* — Jean F Duverne
(74) *Attorney, Agent, or Firm* — Osha Bergman Watanabe & Burton LLP

(57) ABSTRACT

A welding structure includes: a first metal member and a second metal member that are superimposed and welded together. The first metal member has a hole. The second metal member includes a nugget portion where a part of the second metal member has been melted by heat of laser light and has re-solidified. A peripheral portion of the hole in the first metal member covers the nugget portion. A part of the nugget portion is exposed through the hole.

5 Claims, 6 Drawing Sheets

(51) Int. Cl.
   *H01R 4/02*      (2006.01)
   *H01R 12/59*     (2011.01)
   *H01R 43/02*     (2006.01)
   *B23K 103/20*    (2006.01)
   *B23K 103/22*    (2006.01)

(52) U.S. Cl.
   CPC ...... *H01R 43/0221* (2013.01); *B23K 2103/20* (2018.08); *B23K 2103/22* (2018.08)

(58) Field of Classification Search
   CPC .. B23K 2101/42; B23K 26/24; B23K 26/244; B23K 2103/10; B23K 2103/12
   See application file for complete search history.

(56) References Cited

FOREIGN PATENT DOCUMENTS

| | | | |
|---|---|---|---|
| CN | 102896398 | A | 1/2013 |
| CN | 105358282 | A | 2/2016 |
| CN | 105855706 | A | 8/2016 |
| CN | 105899323 | A | 8/2016 |
| DE | 102016118986 | A1 | 4/2017 |
| EP | 2684637 | A1 | 1/2014 |
| JP | S57091895 | A | 6/1982 |
| JP | H08-332582 | A | 12/1996 |
| JP | H10334956 | A | 12/1998 |
| JP | H11-138281 | A | 5/1999 |
| JP | 2005347143 | A | 12/2005 |
| JP | 2007265962 | A | 10/2007 |
| JP | 2008212993 | A | 9/2008 |
| JP | 2013127906 | A | 6/2013 |
| JP | 2016-196017 | A | 11/2016 |
| WO | 2012164839 | * | 12/2012 |
| WO | 2014123022 | A1 | 8/2014 |
| WO | 2016128705 | A1 | 8/2016 |

OTHER PUBLICATIONS

Office Action issued in counterpart Chinese Patent Application No. CN 201880061937.6 dated Aug. 12, 2021 (8 pages).

* cited by examiner

WELDING STRUCTURE, WIRING BOARD WITH METAL PIECE, AND WELDING METHOD

CROSS-REFERENCE TO RELATED APPLICATIONS

This is a U.S. National Stage application of International Application No. PCT/JP2018/048031 filed Dec. 27, 2018, which claims benefit of priority from Japanese Patent Application No. 2017-253541 filed on Dec. 28, 2017. These references are incorporated herein by reference in their entirety.

TECHNICAL FIELD

The present invention relates to a welding structure, a wiring board with a metal piece, and a welding method.

BACKGROUND

In the related art, as shown in PTL 1, a welding method in which a first metal member and a second metal member are superimposed and an interface between the two members is irradiated with laser light has been known. After welding, the first metal member and the second metal member are fixed and electrically connected.

In this type of welding method, bonding strength and electric resistance need to be improved.

One or more embodiments of the present invention improve bonding strength and reduce electric resistance in a welding structure.

PATENT LITERATURE

Patent Document 1
Japanese Unexamined Patent Application, First publication No. H 10-334956

SUMMARY

A welding structure according to one or more embodiments of the present invention include a first metal member and a second metal member that are superimposed and welded together, in which the first metal member has a hole, the second metal member has a nugget portion that is solidified again (i.e., re-solidified) after being melted by heat, a peripheral portion of the hole in the first metal member covers the nugget portion, and a part of the nugget portion is exposed through the hole.

Here, in a cross-sectional view along an up-down direction in which the first metal member and the second metal member are superimposed, an interface between the nugget portion and the non-melted portion in the second metal member may include a protruding interface that protrudes toward the first metal member in the up-down direction.

A wiring board with a metal piece according to one or more embodiments of the present invention includes a flexible printed circuit having a wiring pattern, and a base and a coverlay sandwiching the wiring pattern; and a metal piece welded to the wiring pattern, in which the wiring pattern has a hole, the metal piece has a nugget portion that is solidified again after being melted by heat, a peripheral portion of the hole in the wiring pattern covers the nugget portion, and a part of the nugget portion is exposed through the hole.

The welding method according to one or more embodiments of the present invention includes a preparation step of superimposing a first metal member having copper as a main component and a hole formed thereon on an upper surface of a second metal member having aluminum as a main component; and an irradiation step of applying laser light near the hole from above to weld the first metal member and the second metal member, in which a trajectory of the laser light in the irradiation step is spiral across the hole, in a top view.

A welding method according to one or more embodiments of the present invention includes a preparation step of superimposing a first metal member having a hole on an upper surface of a second metal member; a fixing step of fixing the first metal member and the second metal member with a jig; and an irradiation step of applying laser light near the hole from above through a jig hole formed in the jig to weld the first metal member and the second metal member, in which in a top view, a trajectory of the laser light in the irradiation step is annular from a first point located outside the hole to a second point located inside the hole, and $0<R2<D1\div2<R1<D2\div2$ is satisfied when a diameter of the hole is represented by D1, a diameter of the jig hole is represented by D2, a distance between a central axis of the hole and the first point is represented by R1, and a distance between the central axis and the second point is represented by R2.

In the welding method according to one or more embodiments, a main component of the first metal member may be copper, a main component of the second metal member may be aluminum, and the trajectory may be spiral in a top view.

According to one or more embodiments of the present invention, in a welding structure, bonding strength can be improved and electric resistance can be reduced.

DETAILED DESCRIPTION

Hereinafter, a welding method, a welding structure, and a wiring board with a metal piece according to one or more embodiments will be described with reference to the drawings. Note that the present invention is not limited to the following embodiments.

Direction Definition

Figure 1A:
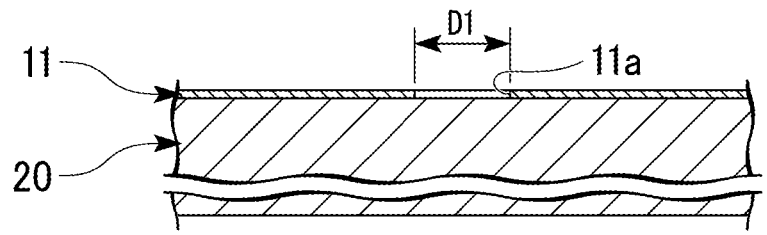
FIG. 1A is a schematic diagram showing a welding method according to one or more embodiments.

In one or more embodiments, a description will be given of a welding method or the like for welding the first metal member 11 of a thin film shape as shown in FIG. 1A to the second metal member 20. The first metal member 11 is superimposed on the surface (upper surface) of the second metal member 20. Hereinafter, the direction in which the first metal member 11 and the second metal member 20 are superimposed is referred to as an up-down direction. Further, along the up-down direction, the first metal member 11 side is referred to as an upper side, and the second metal member 20 side is referred to as a lower side.

A straight line that passes through the center of a hole 11a described later in the first metal member 11 and extends in the up-down direction is referred to as a central axis C (see FIGS. 2 and 3). A direction that intersects the central axis C in plan view as viewed in the up-down direction is referred to as a radial direction.

The first metal member 11 is formed in a thin film shape. The shape of the second metal member 20 is not particularly limited, but may be a film shape, a plate shape, a block shape, or the like. The materials of the first metal member 11 and the second metal member 20 are different from each other. The melting point of the first metal member 11 may be higher than the melting point of the second metal member 20. The first metal member 11 is formed of, for example, a metal (copper alloy) containing copper as a main component. The second metal member 20 is formed of, for example, a metal (aluminum alloy) containing aluminum as a main component.

Welding Method

FIGS. 1A to 1D are explanatory views of the welding method according to one or more embodiments, and show a cross section along the up-down direction. When welding the first metal member 11 and the second metal member 20, first, as shown in FIG. 1A, the first metal member 11 is superimposed on the upper surface of the second metal member 20 (preparation step). At this time, a hole 11a is formed in the first metal member 11 in advance. The shape of the hole 11a may be circular or substantially circular. In one or more embodiments, the inner diameter (diameter) of the hole 11a is represented as a hole diameter D1. The hole diameter D1 is, for example, about 0.5 mm.

Figure 1B:
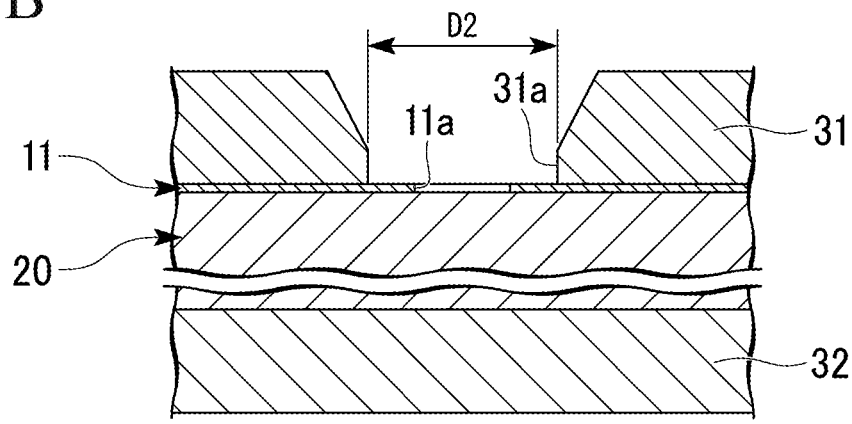
FIG. 1B is a diagram showing a step following FIG. 1A.

Next, as shown in FIG. 1B, the first metal member 11 and the second metal member 20 are fixed by jigs 31 and 32 (fixing step). More specifically, the first metal member 11 and the second metal member 20 are vertically sandwiched between the upper jig 31 and the lower jig 32. A jig hole 31a is formed in the upper jig 31. In one or more embodiments, the inner diameter (diameter) of the jig hole 31a is represented as a jig hole diameter D2. The jig hole diameter D2 is, for example, 1 mm, and is larger than the hole diameter D1. The position of the upper jig 31 with respect to the first metal member 11 is determined such that the center of the jig hole 31a and the center of the hole 11a substantially match in plan view. Since the upper jig 31 and the lower jig 32 sandwich the first metal member 11 and the second metal member 20 with a predetermined pressure, the relative positions of the members are fixed.

Figure 1C:
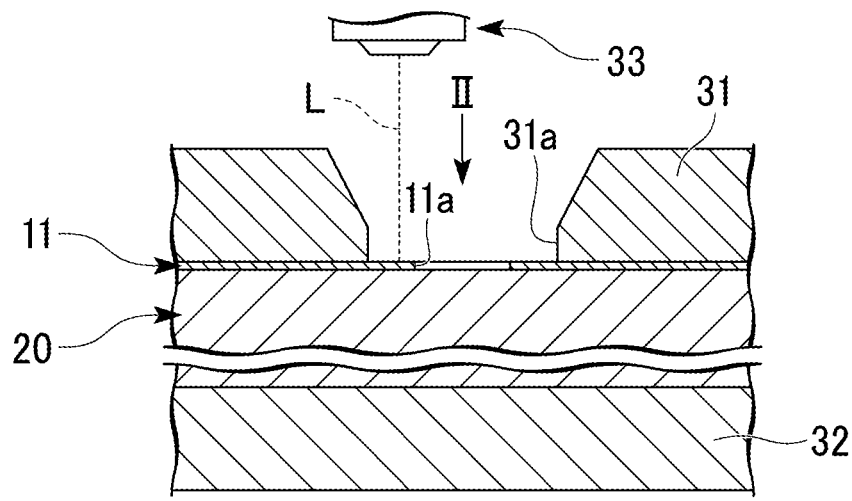
FIG. 1C is a diagram showing a step following FIG. 1B.

Next, as shown in FIG. 1C, the laser light L is emitted downward from a laser apparatus 33 for welding and is applied near the hole 11a (irradiation step). The laser light L is applied to the first metal member 11 or the second metal member 20 through the jig hole 31a of the upper jig 31. At this time, the irradiation position of the laser light L moves so as to trace a predetermined trajectory T as shown in FIG. 2.

Figure 2:
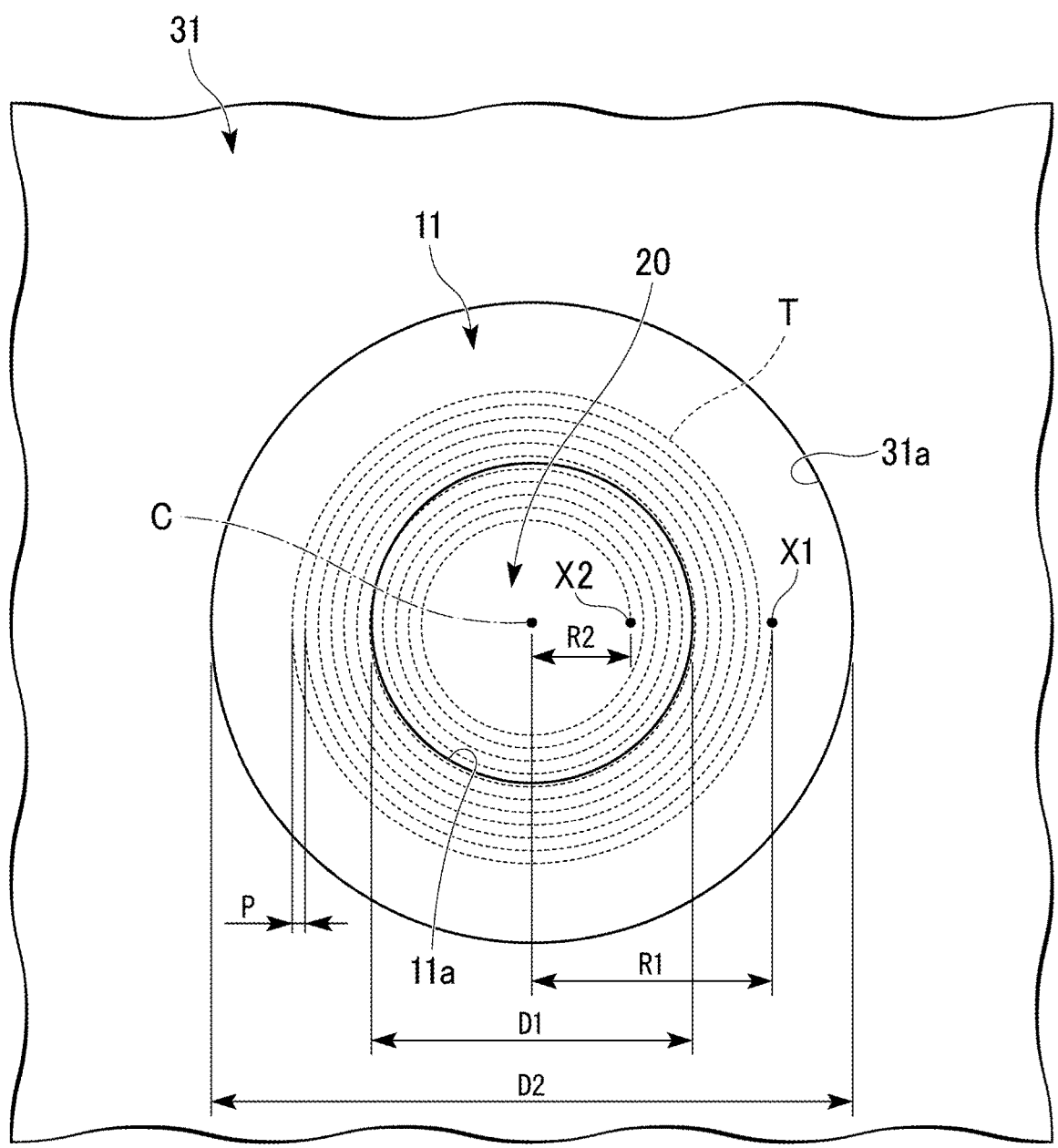
FIG. 2 is a view taken in the direction of arrow II in FIG. 1C.

FIG. 2 is a view taken in the direction of arrow II in FIG. 1C. The dashed line in FIG. 2 indicates the trajectory T of the laser light L. In a top view, the trajectory T in one or more embodiments has a spiral shape substantially concentric with the hole 11a, starting at a first point X1 located radially outside the hole 11a and ending at a second point X2 located radially inside the hole 11a. Hereinafter, the pitch of the spiral trajectory T is referred to as a pitch P. Further, in a top view, the distance between the central axis C of the hole 11a and the first point X1 is represented as an outer radius R1, and the distance between the central axis C and the second point X2 is represented as an inner radius R2. The trajectory T can be said to be substantially annular with an inner diameter of 2×R2 and an outer diameter of 2×R1. The hole diameter D1, the jig hole diameter D2, the outer radius R1, and the inner radius R2 are set so as to satisfy the following mathematical expression (1).

$$0 < R2 < D1 \div 2 < R1 < D2 \div 2 \qquad (1)$$

Figure 1D:
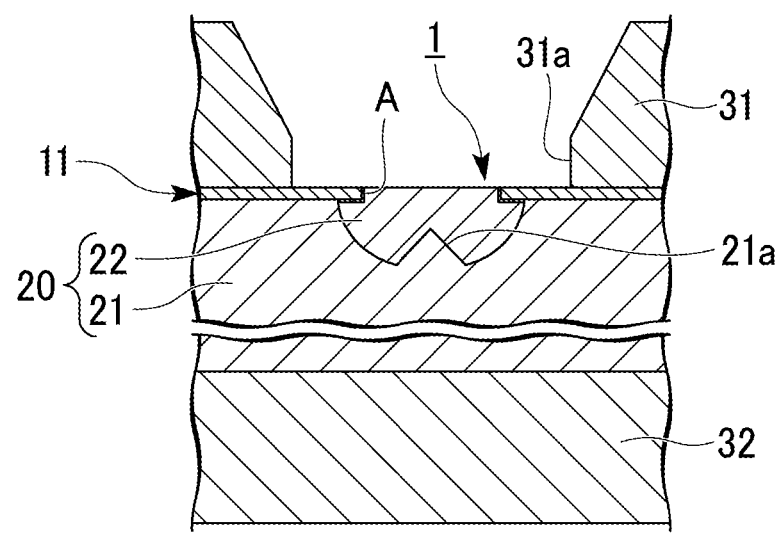
FIG. 1D is a diagram showing a step following FIG. 1C.

By applying the laser light L, the first metal member 11 and the second metal member 20 are partially melted. Thereby, as shown in FIG. 1D, an interface between the non-melted portion 21 and the nugget portion (melted portion) 22 appears in the second metal member 20. An eutectic portion A is formed at the interface between the first metal member 11 and the second metal member 20. Here, the non-melted portion 21 is a portion of the second metal member 20 that is not melted by the heat of the laser light L. The nugget portion 22 is a portion of the second metal member 20 that has been melted by the heat of the laser light L and then solidified again. The eutectic portion A is a portion where the first metal member 11 and the second metal member 20 are melted and mixed, and solidified in the eutectic state. The shapes of the non-melted portion 21, the nugget portion 22, and the eutectic portion A can be checked, for example, by cutting the portion or performing X-ray photography, after welding.

Welding Structure

Next, the welding structure 1 obtained by the above welding method will be described with reference to FIG. 3. FIG. 3 is an enlarged view around the nugget portion 22 in FIG. 1D. As shown in FIG. 3, the interface between the nugget portion 22 and the non-melted portion 21 includes a protruding interface 21a that is convex upward. The protruding interface 21a is located at a radially central portion of the nugget portion 22. This is because the trajectory T of the laser light L is substantially annular in a top view, as described above. More specifically, since the laser light L is not applied near the central axis C in FIG. 2, the portion closer to the central axis C of the second metal member 20 is not heated and is not melted. In addition, since the laser light L is applied from above, the lower part of the second metal member 20 does not receive transmitted heat and is not melted. Therefore, a protruding interface 21a as shown in FIG. 3 is formed.

By forming such a protruding interface 21a, separation (peeling) is less likely to occur at the interface between the non-melted portion 21 and the nugget portion 22, and the bonding strength can be increased. Further, the nugget portion 22 has a shape that partially enters the inside of the hole 11a of the first metal member 11 in the radial direction and is fitted into the hole 11a. Thereby, the bonding strength between the first metal member 11 and the second metal member 20 can be further increased.

A part of the nugget portion 22 is exposed through the hole 11a. Further, the nugget portion 22 partially enters below the first metal member 11. In other words, the peripheral portion of the hole 11a in the first metal member 11 covers the nugget portion 22 from above. In one or more embodiments, a portion of the first metal member 11 that covers the nugget portion 22 is called an overlap portion 11b. The reason why the overlap portion 11b is formed is that the melting point of the first metal member 11 is higher than the melting point of the second metal member 20. More specifically, as shown in FIG. 2, when the first metal member 11 is irradiated with the laser light L, the temperature of the first metal member 11 rises, and the heat is transmitted to raise the temperature of the second metal member 20. Since the second metal member 20 having a lower melting point melts faster than the first metal member 11, the second metal member 20 located below the first metal member 11 remains liquid while the first metal member 11 remains solid. By solidifying the liquid second metal member 20, the overlap portion 11b covers the nugget portion 22.

By forming the overlap portion 11b in this manner, the area of the interface where the first metal member 11 and the second metal member 20 are welded increases, and the welding strength can be further increased.

In addition, the inner diameter of the hole 11a after welding (hereinafter, referred to as a hole diameter D1' after welding) is larger than the hole diameter D1. This is because the portion of the first metal member 11 near the hole 11a is melted and mixed with the second metal member 20 to form the eutectic portion A. The eutectic portion A is formed over the inner peripheral surface of the hole 11a and the lower surface of the overlap portion 11b. The eutectic portion A may be thin because it is brittle and has low strength. In one or more embodiments, the thickness of the eutectic portion A can be easily controlled by adjusting the dimensions P, R1, R2, D1, or the like.

Wiring Board with Metal Piece

Figure 4A:
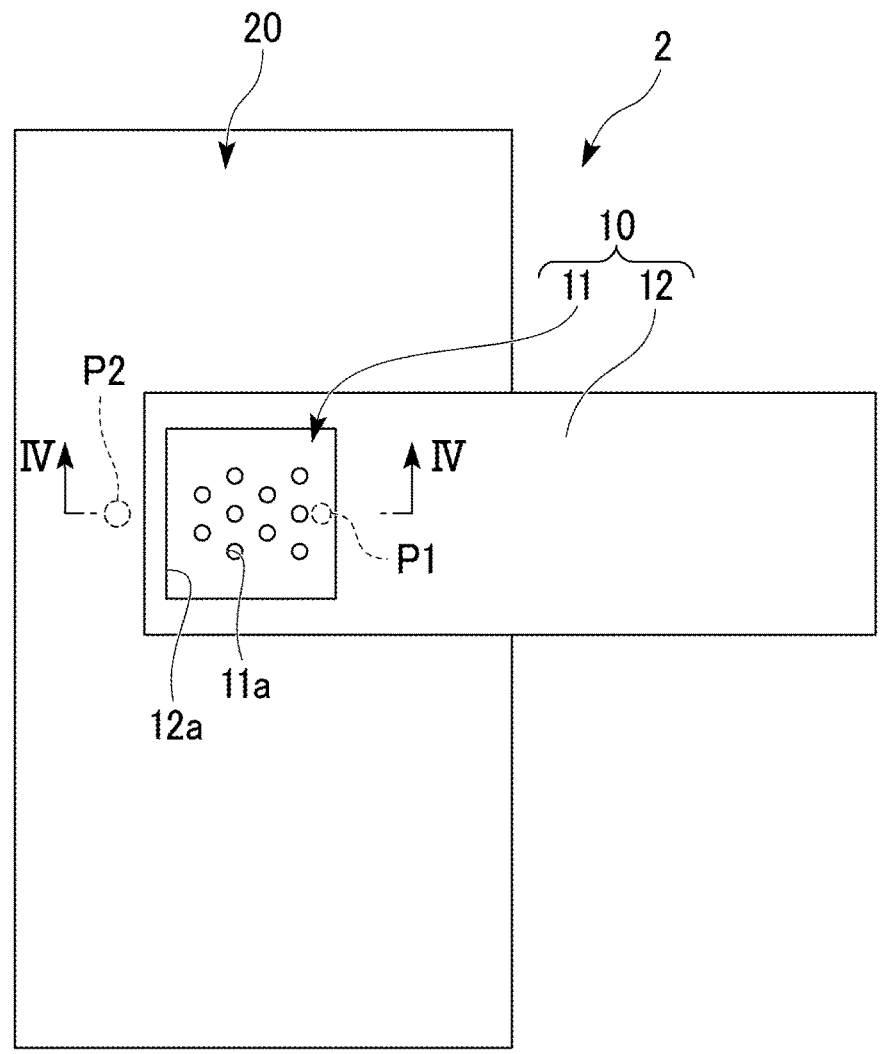
FIG. 4A is a top view of the wiring board with a metal piece according to one or more embodiments.
Figure 4B:
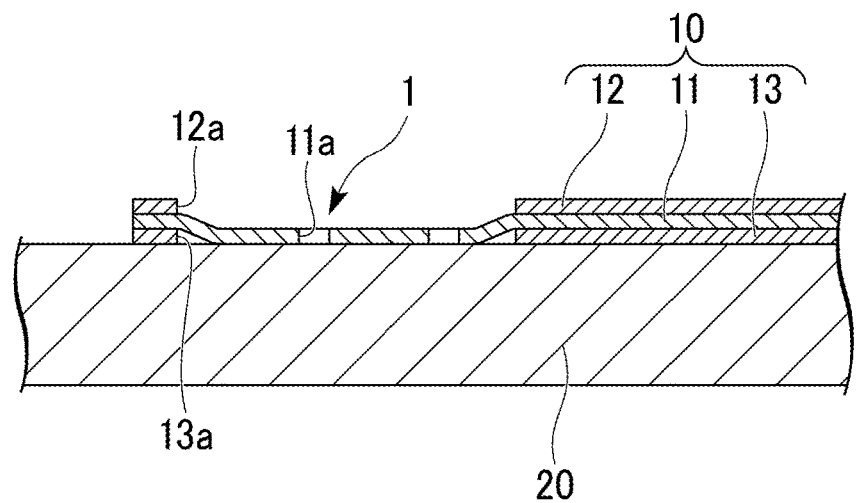
FIG. 4B is a sectional view taken along line IV-IV in FIG. 4A.

The welding structure 1 according to one or more embodiments can be applied to a wiring board 2 with a metal piece as shown in FIGS. 4A and 4B, for example. The wiring board 2 with a metal piece includes a flexible printed circuit (FPC) 10 and a metal piece (second metal member) 20.

As shown in FIG. 4B, the flexible printed circuit 10 includes a wiring pattern (first metal member) 11, a base 13 and a coverlay 12 sandwiching the wiring pattern 11. In the example of FIGS. 4A and 4B, the coverlay 12 and the base 13 are provided with rectangular openings 12a and 13a, respectively. The wiring pattern 11 is exposed through these openings 12a and 13a. A plurality of holes 11a are formed in the portion of the wiring pattern 11 that is exposed through the openings 12a and 13a. The exposed portion is bent downward and superimposed on the upper surface of the metal piece 20 through the opening 13a of the base 13.

As described above, the wiring pattern 11 and the metal piece 20 are partially superimposed, and the wiring pattern 11 and the metal piece 20 are welded by using the bonding method shown in FIGS. 1A to 1D, and these can be electrically connected. Further, by performing welding around each of the plurality of holes 11a, the bonding strength can be increased and the electric resistance can be reduced.

EXAMPLES

Next, the effect of the presence or absence of the hole 11a on the bonding strength and the electric resistance will be described using an example.

In the present example, the wiring board 2 with a metal piece as shown in FIG. 4A is manufactured by using the bonding method shown in FIGS. 1A to 1D. However, in some samples, the hole 11a is not formed in the first metal member (wiring pattern) 11 before welding. "Without holes" in Table 1 below indicates a sample in which the hole 11a is not formed before welding. "With holes" in Table 1 below indicates a sample in which holes 11a are formed before welding.

TABLE 1

| Laser Output | Resistance Value (mΩ) | | Bonding Strength (kgf) | |
| --- | --- | --- | --- | --- |
| | Without holes | With holes | Without holes | With holes |
| 80% | 0.31 | 0.21 | 3.13 | 3.62 |
| 80% | 0.42 | 0.23 | 2.28 | 3.36 |
| 70% | 0.33 | 0.26 | 2.86 | 3.42 |
| Average | 0.35 | 0.23 | 2.76 | 3.47 |

In the present example, the trajectory T of the laser light L is formed in a spiral shape as shown in FIG. 2. The starting point of the trajectory T is a first point X1 located radially outside the hole 11a, and the ending point is a second point X2 located radially inside the hole 11a. That is, the trajectory T has a spiral shape from the outside to the inside of the hole 11a. The trajectory T of the laser light L has a pitch P of 0.04 mm, an outer radius R1 of 0.375 mm, and an inner radius R2 of 0.155 mm. The laser apparatus 33 uses a fiber laser having a maximum output of 300 W. A galvano scanner is used for movement to trace the trajectory T.

The laser output in Table 1 shows the ratio to the maximum output, and is set to 70% to 80% in the present example. The scanning speed when the laser light L traces the trajectory T is 600 mm/s. The jig hole diameter D2 is 1 mm. The first metal member 11 is a copper foil having a thickness of 0.035 mm. In the "with holes" sample, a total of ten holes 11a arranged as shown in FIG. 4A are formed in the first metal member 11. Each hole diameter D1 is 0.5 mm. The second metal member 20 is an aluminum plate (A1050) having a thickness of 1 mm. Note that the conditions for the sample "without holes" are the same as the conditions for the sample "with holes", except that the hole 11a is not formed.

Under the above conditions, the hole diameter D1' after welding (see FIG. 3) of the sample with holes is 0.85 to 0.9 mm.

Resistance Value

"Resistance value" shown in Table 1 is a result of measuring the electric resistance between points P1 and P2 shown in FIG. 4A for each sample. The interval between the points P1 and P2 is 10 mm.

As shown in Table 1, the sample without holes has an average resistance value of 0.35 mΩ and the sample with holes has an average resistance value of 0.23 mΩ. Thus, the electric resistance can be reduced by about 34% by forming the hole 11a in advance.

Bonding Strength

Figure 5:
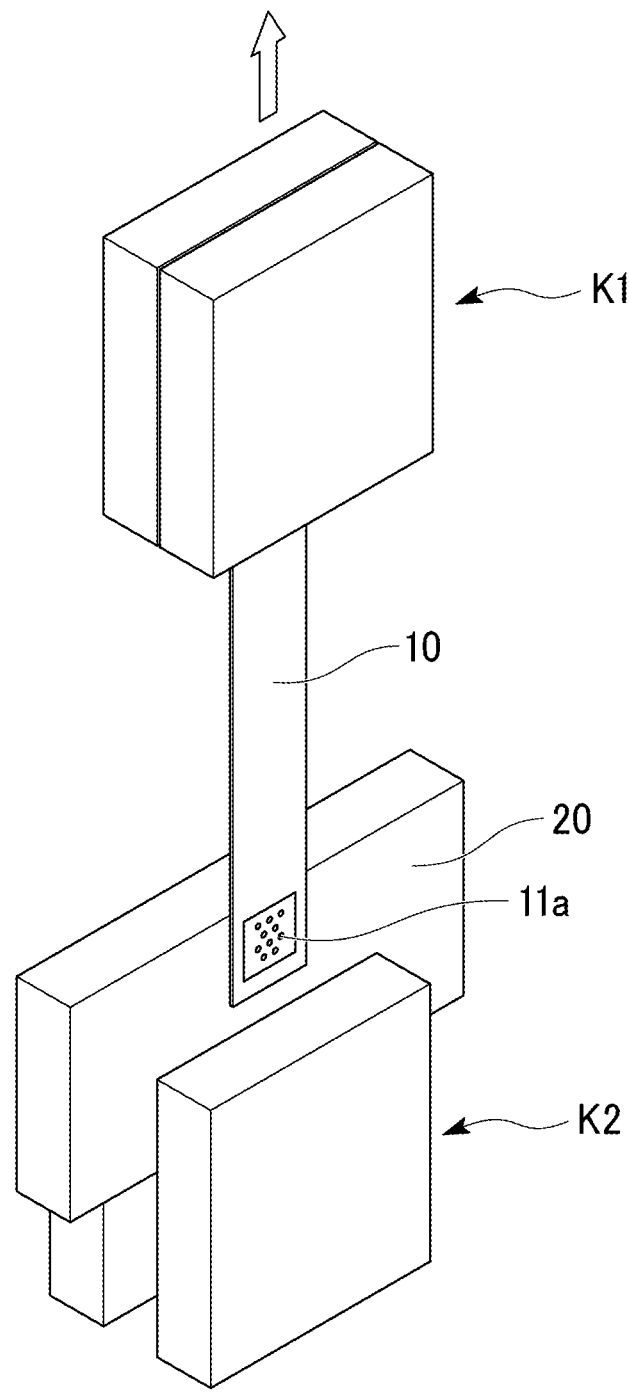
FIG. 5 is a diagram showing a method of testing bonding strength.

"Bonding strength" shown in Table 1 is a result of measuring the bonding strength of each sample using a tensile tester as shown in FIG. 5. More specifically, the flexible printed circuit 10 is clamped by the first clamp K1, and the metal piece 20 is clamped by the second clamp K2.

Then, the maximum value of the tensile force when the first clamp K1 and the second clamp K2 are separated at a speed of 10 mm/min is recorded as the bonding strength.

As shown in Table 1, the sample without holes has an average bonding strength of 2.76 kgf, and the sample with holes has an average bonding strength of 3.47 kgf. Thus, by forming the hole 11a in advance, the bonding strength can be improved by about 26%. This is because the welding structure shown in FIG. 3 is obtained by forming the hole 11a in advance, and separation (peeling) is less likely to occur between the first metal member 11 and the second metal member 20 or between the nugget portion 22 and the non-melted portion 21.

As described above, the welding method according to one or more embodiments includes the preparation step of superimposing the first metal member 11 having the hole 11a formed thereon on the upper surface of the second metal member 20, and the irradiation step of applying laser light L near the hole 11a from above to weld the first metal member 11 and the second metal member 20. Then, in a top view, the trajectory T of the laser light L in the irradiation step is annular from the first point X1 located outside the hole 11a to the second point X2 located inside the hole 11a (across the hole 11a). Thereby, the welding structure 1 as shown in FIG. 3 is obtained.

In the welding structure 1, the peripheral portion of the hole 11a covers the nugget portion 22 of the second metal member 20. Thereby, the area of the interface where the first metal member 11 and the second metal member 20 are bonded increases, and the bonding strength can be improved. Further, as shown in the example, the electric resistance between the first metal member 11 and the second metal member 20 can be reduced.

Figure 3:
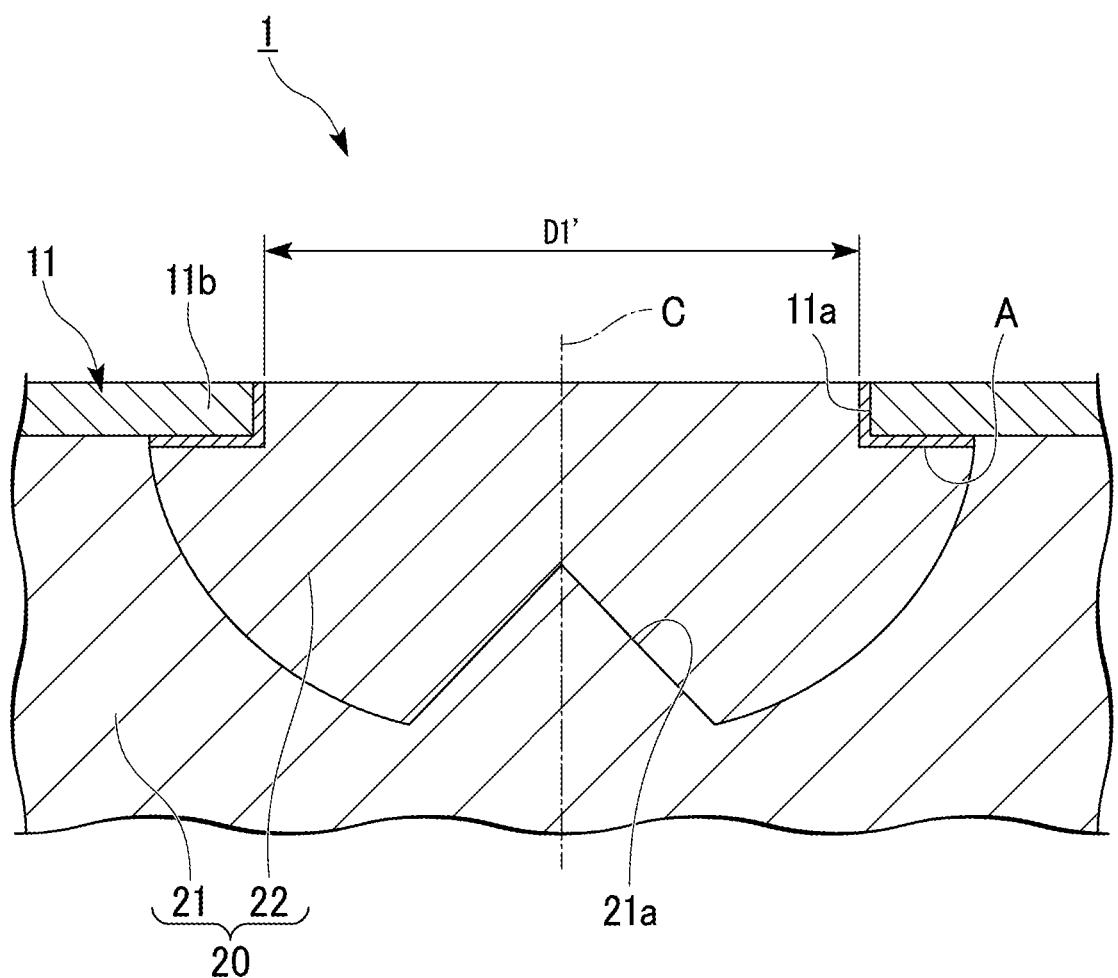
FIG. 3 is a sectional view of the welding structure according to one or more embodiments.

Further, as shown in FIG. 3, in a cross-sectional view along the up-down direction, the interface between the nugget portion 22 and the non-melted portion 21 in the second metal member 20 includes a protruding interface 21a that protrudes upward. Thereby, the occurrence of separation (peeling) between the non-melted portion 21 and the nugget portion 22 is suppressed, and the bonding strength can be more reliably increased.

Further, since the melting point of the first metal member 11 is higher than the melting point of the second metal member 20, the second metal member 20 melts faster than the first metal member 11, so that the overlap portion 11b of the first metal member 11 is easily formed.

The thickness of the eutectic portion A can be easily controlled by adjusting the welding parameters P, R1, R2, D1, or the like, because the trajectory T of the laser light L is spiral in a top view.

Further, by applying the welding method or the welding structure 1 as described above to the wiring board 2 with a metal piece, the bonding strength between the wiring pattern 11 and the metal piece 20 is increased, and the electric resistance between the wiring pattern 11 and the metal piece 20 can be reduced.

It should be noted that the technical scope of the present invention is not limited to the above-described embodiments, and various modifications can be made without departing from the spirit of the present invention.

For example, the welding method and the welding structure 1 of the above-described embodiments may be used for applications other than the wiring board 2 with a metal piece.

Further, the trajectory T of the laser light L may be directed from the radial inside (the second point X2) of the hole 11a to the radial outside (the first point X1).

Further, the trajectory T may be substantially annular as a whole, for example, by making the trajectory radial about the central axis C.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

REFERENCE SIGNS LIST

1 Welding structure
2 Wiring board with metal piece
10 Flexible printed circuit
11 First metal member (wiring pattern)
11a Hole
12 Coverlay
13 Base
20 Second metal member (metal piece)
22 Nugget portion
21a Protruding interface

What is claimed is:

1. A welding structure comprising:
a first metal member and a second metal member that are superimposed in an up-down direction and welded together,
wherein the first metal member has a hole that passes through the first metal member in the up-down direction,
wherein the first metal member is disposed on an upper surface of the second metal member,
wherein the second metal member comprises a nugget portion where a part of the second metal member has been melted by heat of laser light that is irradiated from above and has re-solidified,
wherein a peripheral portion of the hole in the first metal member covers the nugget portion,
wherein a part of the nugget portion is exposed through the hole, and
wherein in a cross-sectional view along the up-down direction, an interface between the nugget portion and a non-melted portion in the second metal member comprises a protruding interface that protrudes toward the first metal member in the up-down direction.

2. The welding structure according to claim 1, wherein a melting point of the first metal member is higher than a melting point of the second metal member.

3. A wiring board with a metal piece comprising:
a flexible printed circuit comprising:
a wiring pattern; and
a base and a coverlay that sandwich the wiring pattern; and
a metal piece welded to the wiring pattern,
wherein the wiring pattern has a hole that passes through the wiring pattern in an up-down direction in which the flexible printed circuit and the metal piece are superimposed,
wherein the flexible printed circuit is disposed on an upper surface of the metal piece,
wherein the metal piece comprises a nugget portion where a part of the metal piece has been melted by heat of laser light that is irradiated from above and has re-solidified,
wherein a peripheral portion of the hole in the wiring pattern covers the nugget portion, and wherein a part of the nugget portion is exposed through the hole.

4. A welding method comprising:

a preparation step of superimposing a first metal member on an upper surface of a second metal member, wherein the first metal member has a hole;

a fixing step of fixing the first metal member and the second metal member with a jig; and an irradiation step of applying laser light near the hole from above through a jig hole that is disposed in the jig and welding the first metal member and the second metal member, wherein in a top view, a trajectory of the laser light in the irradiation step is annular from a first point outside the hole to a second point inside the hole, and $0<R2<D1\div2<R1<D2\div2$ is satisfied where a diameter of the hole is represented by $D1$, a diameter of the jig hole is represented by $D2$, a distance between a central axis of the hole and the first point is represented by $R1$, and a distance between the central axis and the second point is represented by $R2$.

5. The welding method according to claim 4, wherein the first metal member comprises copper as a main component, the second metal member comprises aluminum as a main component, and the trajectory is spiral in a top view.

* * * * *